(12) United States Patent
Choi et al.

(10) Patent No.: US 7,817,429 B2
(45) Date of Patent: Oct. 19, 2010

(54) PRINTED CIRCUIT BOARD ASSEMBLY AND LIQUID CRYSTAL DISPLAY HAVING THE SAME

(75) Inventors: Jae-Min Choi, Asan-si (KR); Jae-Hwan Chun, Suwon-si (KR); Jong-Ho Won, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 10 days.

(21) Appl. No.: 12/276,767

(22) Filed: Nov. 24, 2008

(65) Prior Publication Data

US 2009/0135566 A1 May 28, 2009

(30) Foreign Application Priority Data

Nov. 26, 2007 (KR) .................... 10-2007-0120765

(51) Int. Cl.
*H05K 7/20* (2006.01)
(52) U.S. Cl. .................. 361/720; 361/679.54; 361/704; 361/719; 165/121; 165/104.33; 165/185
(58) Field of Classification Search ............ 361/679.46, 361/679.54, 704–712, 715, 720; 165/80.3, 165/104.33, 185; 257/706–727; 174/15.1, 174/16.3, 252; 411/508–511, 518, 521, 908, 411/913; 24/508, 453, 457, 458, 297
See application file for complete search history.

(56) References Cited

U.S. PATENT DOCUMENTS

| | | | | |
|---|---|---|---|---|
| 5,883,782 | A * | 3/1999 | Thurston et al. | 361/704 |
| 5,883,783 | A * | 3/1999 | Turturro | 361/704 |
| 6,042,388 | A * | 3/2000 | Tustaniwskyj et al. | 439/66 |
| 6,055,159 | A * | 4/2000 | Sun | 361/704 |
| 6,229,706 | B1 * | 5/2001 | Cook et al. | 361/719 |
| 6,313,993 | B1 * | 11/2001 | Hinshaw et al. | 361/704 |
| 6,456,490 | B1 * | 9/2002 | Lai | 361/679.54 |
| 6,480,387 | B1 * | 11/2002 | Lee et al. | 361/704 |
| 6,650,113 | B2 * | 11/2003 | Sekiya | 324/258 |

(Continued)

FOREIGN PATENT DOCUMENTS

JP 2006208485 8/2006

(Continued)

*Primary Examiner*—Michael V Datskovskiy
(74) *Attorney, Agent, or Firm*—Cantor Colburn LLP

(57) ABSTRACT

A printed circuit board assembly and a liquid crystal display ("LCD") having the same, and more particularly, to a printed circuit board assembly, wherein a board mounted with a heat dissipation plate and a time controller using a spring clip or a hook spring can prevent the board from sagging. An exemplary embodiment includes a heat dissipation plate, a protection plate and a thermal interface material to dissipate heat from a time controller, thereby efficiently dissipating heat from the time controller. Another exemplary embodiment includes a spring clip or a hook spring to increase contact forces among a protection plate, a heat dissipation plate and a board, thereby further improving heat dissipation performance. Exemplary embodiments of the present invention make it possible to provide a printed circuit board assembly, wherein a spring clip supports the bottom of a region of a board in which a time controller is mounted, thereby preventing sagging of the region of the board in which the time controller and a heat dissipation plate are mounted. An LCD having the printed circuit board assembly is also described.

19 Claims, 4 Drawing Sheets

U.S. PATENT DOCUMENTS

| | | | |
|---|---|---|---|
| 7,095,614 B2 * | 8/2006 | Goldmann | 361/704 |
| 7,375,963 B2 * | 5/2008 | Eckberg et al. | 361/704 |
| 7,428,154 B2 * | 9/2008 | Ishimine et al. | 361/704 |
| 7,495,922 B2 * | 2/2009 | Ploeg et al. | 361/719 |

FOREIGN PATENT DOCUMENTS

| | | |
|---|---|---|
| JP | 2006227427 | 8/2006 |
| KR | 1020070020610 | 2/2007 |

\* cited by examiner

PRINTED CIRCUIT BOARD ASSEMBLY AND LIQUID CRYSTAL DISPLAY HAVING THE SAME

This application claims priority to Korean Patent Application No. 10-2007-0120765, filed on Nov. 26, 2007, and all the benefits accruing therefrom under 35 U.S.C. §119, the contents of which in its entirety are herein incorporated by reference.

BACKGROUND OF THE INVENTION

1. Field of the Invention

The present invention relates to a printed circuit board assembly and a liquid crystal display having the same, and more particularly, to a printed circuit board assembly, wherein a board mounted with a heat dissipation plate and a time controller using a spring clip or a hook spring can be prevented from sagging, and a liquid crystal display having the same.

2. Description of the Related Art

In general, the application range of a liquid crystal display ("LCD") has been extended because of its lightweight, thin profile, low-power drive, full color and high resolution characteristics. Currently, the LCD is used in computers, notebook computers, personal digital assistants ("PDAs"), telephones, televisions ("TVs"), audio/video devices, and the like. In the LCD, a desired image is displayed on a liquid crystal display panel in which the amount of light to be transmitted is controlled according to video signals applied to a plurality of control switches arranged in a matrix. In addition, the LCD includes a liquid crystal display panel driving unit, such as a source driver and a gate driver in the form of integrated circuits ("ICs"), for causing a desired image to be displayed on the liquid crystal display panel. The liquid crystal display panel driving unit is connected to a control unit including a time controller and the like.

In a conventional LCD, a thermal pad is attached to the time controller to dissipate heat from the time controller. With the development of technology, a high performance time controller is required. As the performance of the time controller is improved, the amount of heat generated by operation of the time controller is also increased. However, since a heat generation temperature of the time controller itself is too high (e.g., 180° C.), it is difficult to efficiently dissipate heat from the time controller simply by attaching the thermal pad to the time controller, as in the conventional LCD. Therefore, the time controller cannot operate normally.

Moreover, in the conventional LCD, a board with the time controller mounted thereon has a small thickness, and thus, sags due to the weight of the time controller and the thermal pad.

BRIEF SUMMARY OF THE INVENTION

The present invention includes a printed circuit board assembly, wherein heat generated in a time controller can be dissipated as much as possible, and a liquid crystal display having the same.

The present invention includes a printed circuit board assembly, wherein a board with a time controller mounted thereon can be prevented from sagging, and a liquid crystal display having the same.

According to an aspect of the present invention, a printed circuit board assembly includes a board; a semiconductor device mounted on a first surface of the board; a heat dissipation plate mounted on one surface of the semiconductor device; hook springs which bring the semiconductor device and the heat dissipation plate into close contact with each other; and a spring clip, which is disposed on a second surface opposite the first surface of the board, the spring clip having a base plate contacting the second surface of the board and a plurality of extensions extending from the base plate and away from the second surface of the board, the extensions being coupled to the hook springs.

The hook springs may each include a spring and a hook formed at an end of the spring.

The hook springs may each be formed on the heat dissipation plate.

The spring clip may include a hole formed at an end of each of the extensions and coupled with a respective hook spring.

The plurality of extensions may be formed to be equally spaced apart from each other.

The printed circuit board assembly may further include a protection plate in contact with the heat dissipation plate, wherein the protection plate is coupled to the hook springs.

The printed circuit board assembly may further include a thermal interface material disposed between the semiconductor device and the heat dissipation plate.

The thermal interface material may include a thermal pad or thermal grease.

The semiconductor device may include a time controller.

According to another aspect of the present invention, a printed circuit board assembly includes a board; a semiconductor device mounted on a first surface of the board; a heat dissipation plate mounted on one surface of the semiconductor device; a spring clip disposed on a second surface opposite the first surface of the board, the spring clip having a base plate contacting the second surface of the board and a plurality of extensions extending from the base plate and away from the second surface of the board; and a fixing member penetrating through the board to fasten the heat dissipation plate and the spring clip to each other.

The fixing member may include a screw or hook.

The fixing member may be integrally formed with the spring clip or heat dissipation plate, or manufactured separately therefrom and then attached thereto.

The plurality of extensions may be formed to be equally spaced apart from one another.

The printed circuit board assembly may further include a thermal interface material disposed between the semiconductor device and the heat dissipation plate.

The thermal interface material may include a thermal pad or thermal grease.

The semiconductor device may include a time controller.

The printed circuit board assembly may further include a protection plate in contact with the heat dissipation plate, wherein the protection plate is coupled to the fixing member.

The protection plate may be integrally formed with the heat dissipation plate, or separately attached thereto.

According to a further aspect of the present invention, a liquid crystal display includes a liquid crystal display panel; a liquid crystal display panel driving unit which drives the liquid crystal display panel; and a backlight unit which supplies light to the liquid crystal display panel, wherein the liquid crystal display panel driving unit includes a board, a semiconductor device mounted on a first surface of the board, a heat dissipation plate mounted on one surface of the semiconductor device, a spring clip disposed on a second surface opposite the first surface of the board, the spring clip having a base plate contacting the second surface of the board and having a plurality of extensions extending from the base plate and away from the second surface of the board, and a fixing member penetrating through the board to fasten the heat dissipation plate and the spring clip to each other.

According to a still further aspect of the present invention, a liquid crystal display includes a liquid crystal display panel; a liquid crystal display panel driving unit which drives the liquid crystal display panel; and a backlight unit which supplies light to the liquid crystal display panel, wherein the liquid crystal display panel driving unit includes a board, a semiconductor device mounted on a first surface of the board, a heat dissipation plate mounted on one surface of the semiconductor device, a hook spring which penetrates through the board to bring the semiconductor device and the heat dissipation plate into close contact with each other and has a spring and a hook formed at an end of the spring, and a spring clip coupled to the hook spring and disposed on a second surface opposite the first surface of the board.

BRIEF DESCRIPTION OF THE DRAWINGS

Exemplary embodiments of the present invention can be understood in more detail from the following description taken in conjunction with the accompanying drawings, in which.

DETAILED DESCRIPTION OF THE INVENTION

Figure 1:
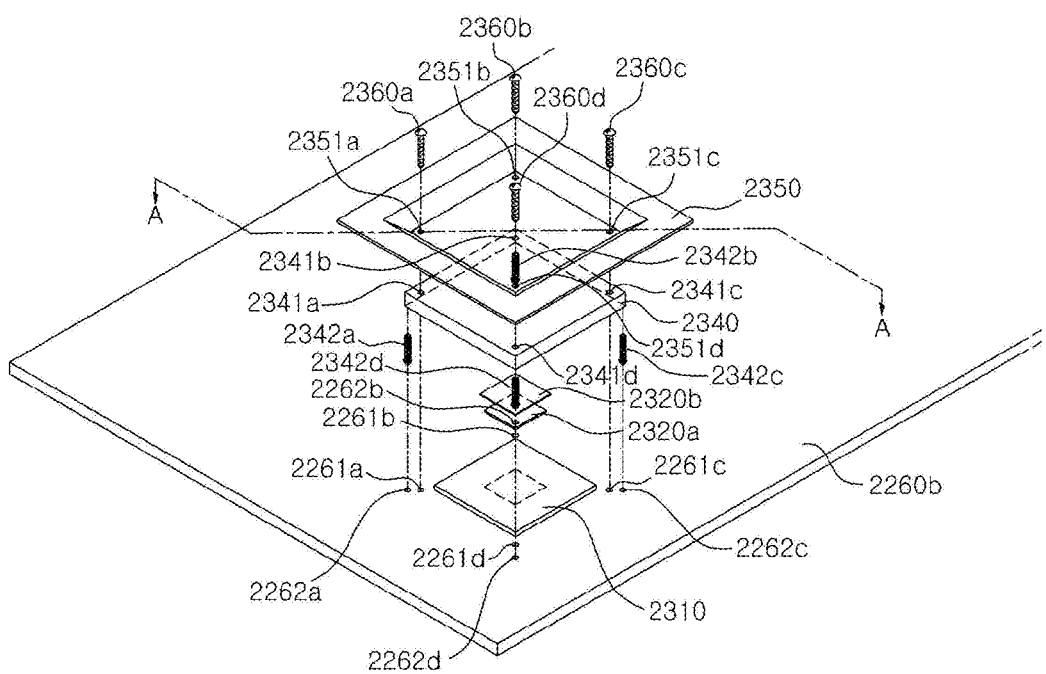
FIG. 1 is an exploded perspective view schematically illustrating a printed circuit board assembly according to a first exemplary embodiment of the present invention.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Figure 2:
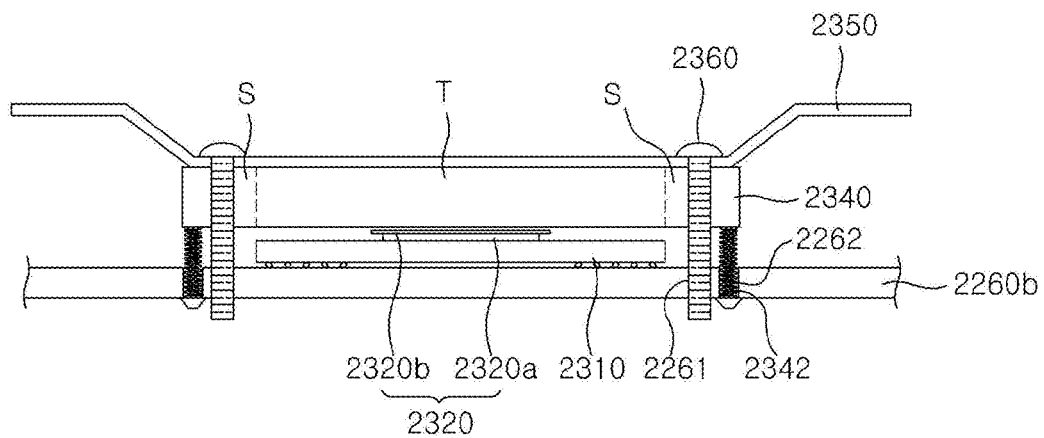
FIG. 2 is an enlarged schematic cross-sectional view taken along line A-A of FIG. 1.

FIG. 1 is an exploded perspective view schematically illustrating a printed circuit board assembly according to a first exemplary embodiment of the present invention, and FIG. 2 is an enlarged schematic cross-sectional view taken along line A-A of FIG. 1.

Referring to FIGS. 1 and 2, the printed circuit board assembly according to the first embodiment of the present invention includes a board 2260*b*, a time controller 2310 mounted on the board 2260*b*, a heat dissipation plate 2340 mounted on the time controller 2310, and fixing members 2360 mounted to penetrate through the heat dissipation plate 2340 and the board 2260b. In addition, the printed circuit board assembly can include a thermal interface material ("TIM") 2320 disposed between the time controller 2310 and the heat dissipation plate 2340, and a protection plate 2350 disposed on the heat dissipation plate 2340.

The board 2260b supports the time controller 2310 and may include a printed circuit board ("PCB"). It will be apparent that wiring (not shown) for applying a necessary signal to the time controller 2310 can be formed on the board 2260b with the time controller 2310 mounted thereon, and holes, e.g., holes 2261, can be formed in the board 2260b numbering as many as the fixing members 2360 to mount the fixing members 2360 therein. In this embodiment, as four fixing members 2360 are provided, the board holes 2261 includes first to fourth board holes 2261a to 2261d.

The time controller 2310 controls timing of an applied video signal in a field-programmable gate array ("FPGA") (not shown), and applies a timing control signal to a source driver (not shown) and a gate driver (not shown) for driving a liquid crystal display panel (not shown). The time controller 2310 receives a data signal, a data enable signal, vertical and horizontal synchronization signals, and timing data from an extended display identification data ("EDID") unit (not shown) mounted on the board 2260b, and generates a timing control signal for use in supplying the data to a source driving unit and a gate driving unit. Here, the time controller 2310 can be mounted in the form of an integrated circuit ("IC") on the board 2260b.

The heat dissipation plate 2340 emits heat generated in the time controller 2310 to the outside and can contain a material having high thermal conductivity, for example, a metal such as aluminum, copper, tungsten, pure silver and gold. In this embodiment, a black anodized aluminum block 2340 having an oxide film formed on a surface thereof and a thickness of 3 mm is used. It will be apparent that the thickness and material of the heat dissipation plate 2340 can be varied. In addition, the heat dissipation plate 2340 can be formed in the shape of a polygonal, elliptical or circular plate as viewed in a plane. In this embodiment, a rectangular heat dissipation plate 2340 which has a polygonal shape similar to that of the time controller 2310 is used. It is advantageous to increase a surface area to maximize a heat radiation area of the heat dissipation plate 2340. However, since an inner space of a liquid crystal display ("LCD") in which the printed circuit board assembly is to be mounted is limited, it is necessary to maximize the heat dissipation performance thereof while minimizing the size of the heat dissipation plate 2340. To this end, for example, the protection plate 2350 capable of increasing the heat dissipation area of the heat dissipation plate 2340 can be mounted on the heat dissipation plate 2340. At this time, even though the size of the heat dissipation plate 2340 is minimized, the fixing members 2360 cannot be mounted to penetrate through the time controller 2310, and thus, the heat dissipation plate 2340 should have areas for use in forming heat dissipation plate holes 2341. To this end, the heat dissipation plate 2340 can be divided into a region T overlapping the time controller 2310, and regions S formed with holes for use in mounting the fixing members 2360. In exemplary embodiments, the regions S do not overlap the time controller 2310. At this time, the region T can be positioned at the center of the heat dissipation plate 2340, and the regions S can be the remaining regions of the heat dissipation plate 2340 except for the region T.

In exemplary embodiments, the number of the heat dissipation holes 2341 formed in the heat dissipation plate 2340 correspond to the number of the fixing members 2360. In this embodiment, since the four fixing members 2360 are used, four heat dissipation plate holes 2341 are formed as well. At this time, it is advantageous to form the four heat dissipation plate holes 2341, e.g., first to fourth heat dissipation plate holes 2341a to 2341d, in the regions S at equal intervals in order to securely fix the heat dissipation plate 2340. In addition, when screws are used as the fixing members 2360, threads are formed on inner peripheries of the first to fourth heat dissipation plate holes 2341a to 2341d. It will be apparent that, when bolts and nuts are used as the fixing members 2360, the threads may not be formed. Moreover, the fixing members 2360 may be omitted by integrally forming the heat dissipation plate 2340 and the fixing members 2360. In this case, bolts and nuts or hooks can be used as the fixing members 2360.

The thermal interface material 2320 increases a heat transfer area by maximizing a contact area between the time controller 2310 and the heat dissipation plate 2340, and can include a thermal pad or thermal grease having high thermal conductivity.

Although the heat dissipation plate 2340 and the time controller 2310 are positioned such that their flat surfaces defining each are in contact with each other, the contact surfaces of the heat dissipation plate 2340 and the time controller 2310 are finely rough. Therefore, small voids exist between the two surfaces. Here, the effect of the heat transfer property is proportional to a contact area. That is, since the contact area is decreased due to the small voids, the heat transfer property is degraded. Accordingly, the thermal interface material 2320 is disposed between the heat dissipation plate 2340 and the time controller 2310 to fill the voids between the two surfaces, so that heat transfer can be effectively achieved between the heat dissipation plate 2340 and the time controller 2310. In this embodiment, a thermal pad is used as the thermal interface material 2320. For example, a sprint silicone die 2320a and a Chomerics T725 2320b can be used as the thermal pad. At this time, the T725 2320b is provided between the sprint silicone die 2320a and the heat dissipation plate 2340, and the sprint silicone die 2320a is provided between the T725 2320b and the time controller 2310. In addition, the time controller 2310 is usually a rectangular chip when viewed in a plan view. In this embodiment, the thermal interface material 2320 is also formed in a rectangular shape like the time controller 2310. Of course, the present invention is not limited thereto. The thermal interface material 2320 may be formed in a polygonal, elliptical or circular shape. Moreover, in this embodiment, the thermal interface material 2320 is formed over portions of the contact surfaces of the heat dissipation plate 2340 and the time controller 2340. The present invention is not limited thereto. The thermal interface material 2320 may be formed over the entire contact surfaces of the heat dissipation plate 2340 and the time controller 2310.

The protection plate 2350 protects the heat dissipation plate 2340 and is made of a material having strength sufficient to protect the heat dissipation plate 2340 in exemplary embodiments. In addition, the protection plate 2350 contacts the heat dissipation plate 2340 to obtain an effect of an increased heat dissipation area of the heat dissipation plate 2340, thereby rapidly dissipating heat generated in the time controller 2310. The protection plate 2350 can also be made of the same material as the heat dissipation plate 2340 so as to serve as the heat dissipation plate 2340. In this embodiment, an aluminum plate with a thickness of about 0.6 mm to about 1 mm is used. The thickness and material of the protection plate 2350 can be changed. The protection plate 2350 may be integrally formed with the heat dissipation plate 2340 as a single undivisible unitary part, or manufactured separately therefrom and then attached thereto. In a case where the protection plate 2350 is manufactured separately from the heat dissipation plate 2340, the protection plate 2350 may be made of a material identical to or different from that of the heat dissipation plate 2340.

In addition, the protection plate 2350 can be fixed, together with the heat dissipation plate 2340, to the board 2260b by means of the fixing members 2360. To this end, protection plate holes 2351 can also be formed in the protection plate 2350 to mount the fixing members 2360 therein. Here, the protection plate holes 2351 include first to fourth protection plate holes 2351a to 2351d to be identical in number to the fixing members 2360 according to this embodiment. In exemplary embodiments, the first to fourth protection plate holes 2351a to 2351d are formed at positions corresponding to the first to fourth heat dissipation plate holes 2341a to 2341d so as to easily mount the fixing members 2360 therein. Meanwhile, such a protection plate 2350 may be eliminated.

The fixing members 2360 fix the heat dissipation plate 2340 so that the heat dissipation plate 2340 does not come off of the board 2260b and to improve the close contact of the heat dissipation plate 2340 with the time controller 2310, and can include screws, bolts, nuts and the like, for example, but is not limited thereto. In this embodiment, the fixing members 2360 include the first to fourth fixing members 2360a to 2360d. The first to fourth fixing members 2360a to 2360d penetrate through the first to fourth protection plate holes 2351a to 2351d, the first to fourth heat dissipation plate holes 2341a to 2341d, and the first to fourth board holes 2261a to 2261d, respectively, and then fasten the protection plate 2350, the heat dissipation plate 2340 and the board 2260b together.

Meanwhile, the heat dissipation plate 2340 in this embodiment may not be fastened to the board 2260b by means of screws. That is, instead of the use of screws, the heat dissipation plate 2340 may be fastened to the board 2260b by forming springs in the regions S of the heat dissipation plate 2340 and forming hooks at ends of the springs. In this embodiment, four springs with hooks formed at ends thereof, e.g., first to fourth hook springs 2342a to 2342d are provided. It is advantageous to arrange the first to fourth hook springs 2342a to 2342d so as to equally divide the regions S. In this case, the heat dissipation plate 2340 and the board 2260b can be brought into close contact with each other by means of elasticity of the springs. The hooks formed at the ends of the springs are compressed, inserted into fifth to eighth board holes 2262a to 2262d in the board 2260b, and expanded to fix the heat dissipation plate 2340 to the board 2260b.

In the case where the hook springs 2342 are used, the first to fourth fixing members 2360a to 2360d can be inserted into the first to fourth board holes 2261a to 2261d to merely function to mount the protection plate 2360 on the heat dissipation plate 2340. However, the present invention is not limited thereto. The first to fourth board holes 2261a to 2261d can be eliminated, and the first to fourth hook springs 2342a to 2342d can be fixedly inserted into the fifth to eighth board holes 2262a to 2262d, respectively, to fix the heat dissipation plate 2340 to the board 2260b. When the protection plate 2350 is provided, the hook springs 2342 can be coupled to the protection plate 2350 while eliminating the fixing members 2360, and then inserted, instead of the fixing members 2360, into the protection plate holes 2351, the heat dissipation plate holes 2341 and the board holes 2261, thereby fastening the protection plate 2350, the heat dissipation plate 2340 and the board 2260b together. On the other hand, the hook springs 2342 may be integrally formed with the heat dissipation plate 2340, or manufactured separately therefrom and then attached thereto.

In addition, the printed circuit board assembly according to this embodiment has been described as having the fastening holes, i.e., the four board holes 2261, the four protection plate holes 2351 and the four heat dissipation plate holes 2341. However, the present invention is not limited thereto. The number of each of the board holes 2261, the protection plate holes 2351 and the heat dissipation plate holes 2341 may be smaller or larger than four.

TABLE 1

| Classification | Non-application of heat dissipation means | Thermal pad + Protection plate | Thermal pad + Heat dissipation plate + Protection plate |
|---|---|---|---|
| Temperature (° C.) | 180 | 107.9 | 69.4 |

The heat dissipation performance of the printed circuit board assembly constructed as above according to this embodiment will be compared with the heat dissipation performance of a conventional printed circuit board assembly. Referring to Table 1, when the time controller 2310 is operated without heat dissipation means, the temperature of the time controller 2310 rises to 180° C. When only the thermal pad and the protection plate 2350 are conventionally used in the time controller 2310, the temperature of the time controller 2310 is about 107.9° C. It can be found that, as compared with the non-application of the heat dissipation means, the temperature is lowered by about 73° C., but is still high. When the thermal pad 2320, the heat dissipation plate 2340 and the protection plate 2350 are mounted on the time controller 2310 in accordance with an exemplary embodiment of the present invention, the temperature of the time controller 2310 is about 69.4° C. That is, the temperature is lowered by about 110° C. Therefore, it can be found that heat is efficiently dissipated so that the time controller 2310 can operate normally at an appropriate temperature.

As described above, the printed circuit board assembly according to this embodiment include the heat dissipation plate 2340, the protection plate 2350 and the thermal interface material 2320 in order to dissipate heat from the time controller 2310, thereby efficiently dissipating heat from the time controller 2310.

Next, a printed circuit board assembly according to a second embodiment of the present invention will be described with reference to the accompanying drawings. Descriptions of the following printed circuit board assembly overlapping those of the printed circuit board of the first embodiment of the present invention will be omitted or explained briefly.

Figure 3:
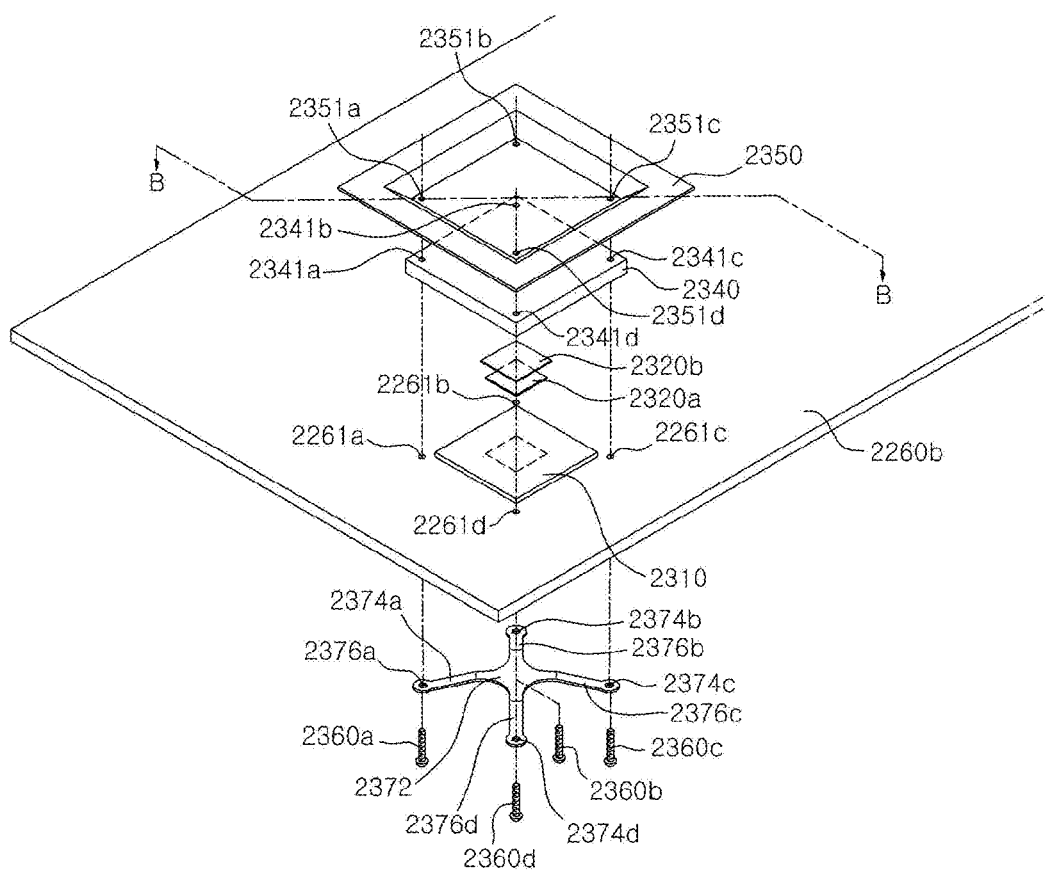
FIG. 3 is an exploded perspective view schematically illustrating a printed circuit board assembly according to a second exemplary embodiment of the present invention.
Figure 4:
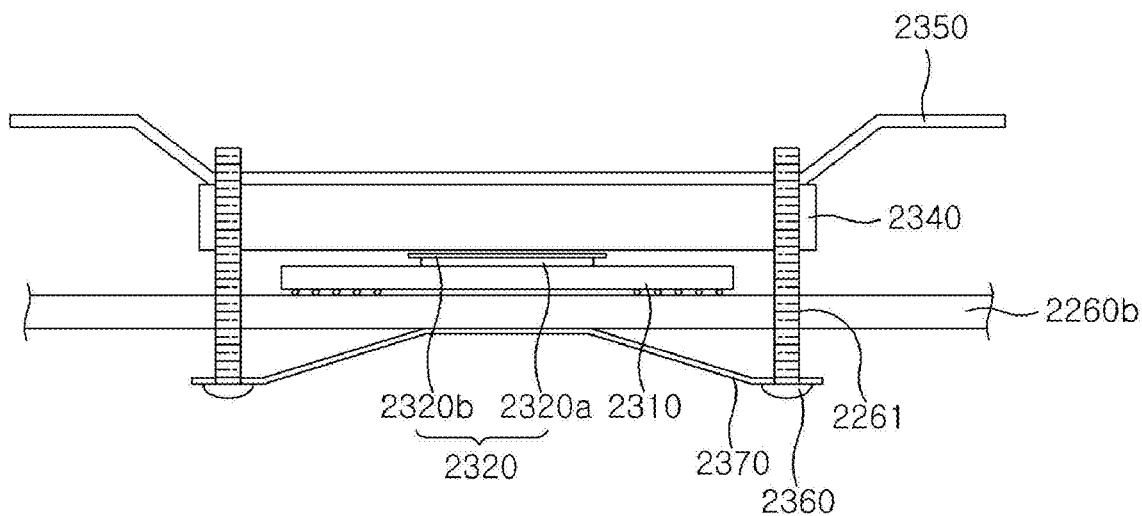
FIG. 4 is an enlarged schematic cross-sectional view taken along line B-B of FIG. 3.
Figure 5:
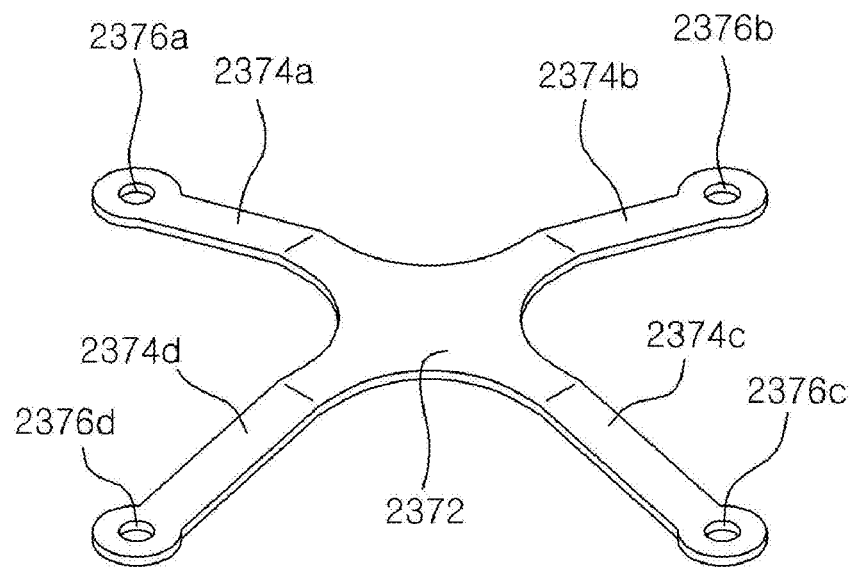
FIG. 5 is a schematic perspective view illustrating a spring clip in the second exemplary embodiment of the present invention.

FIG. 3 is an exploded perspective view schematically illustrating a printed circuit board assembly according to a second exemplary embodiment of the present invention, FIG. 4 is an enlarged schematic cross-sectional view taken along line B-B of FIG. 3, and FIG. 5 is a schematic perspective view illustrating a spring clip 2370 in the second exemplary embodiment of the present invention.

Referring to FIGS. 3 and 4, the printed circuit board assembly according to the second embodiment of the present invention includes a board 2260b, a time controller 2310 mounted on the board 2260b, a heat dissipation plate 2340 mounted on the time controller 2310, a spring clip 2370 disposed at the bottom of the board 2260b, and fixing members 2360 mounted to penetrate through the spring clip 2370, the board 2260b and the heat dissipation plate 2340. Here, a protection plate 2350 may be further disposed on the heat dissipation plate 2340. In the same manner as the first embodiment described above, first to fourth board holes 2261a to 2261d, first to fourth heat dissipation plate holes 2341a to 2341d, and first to fourth protection plate holes 2351a to 2351d may be formed in the board 2260b, the heat dissipation plate 2340 and the protection plate 2350, respectively.

As shown in FIG. 5, the spring clip 2370 includes a base plate 2372, first to fourth extensions 2374a to 2374d extending from the base plate 2372 and bent downwardly at a predetermined angle, and a spring clip hole 2376 formed at each end of the respective first to fourth extensions 2374a to 2374d. It will be apparent that the number of the spring clip holes 2376 may be smaller or larger than four, depending on the number of extensions 2374. The first to fourth extensions 2374a to 2374d are advantageously formed at equal intervals so that the weight applied to the base plate 2372 can be distributed thereto. Although four extensions, i.e., the first to fourth extensions 2374a to 2374d, are formed in this embodiment, the present invention is not limited thereto. Two or more extensions, i.e., a plurality of extensions 2374 may be formed. In addition, the spring clip holes 2376 can include first to fourth spring clip holes 2376a to 2376d to be identical in number to the fixing members 2360 according to this embodiment. In exemplary embodiments, the first to fourth spring clip holes 2376a to 2376d are formed at positions corresponding to those of the first to fourth board holes 2261a to 2261d. Here, in this embodiment, the spring clip 2370 and the fixing members 2360 can be integrally formed or separately from each other. If they are integrally formed with each other, the spring clip holes 2376 can be eliminated, and the fixing members 2360 can be integrally formed with the spring clip 2370 in region S where the spring clip 2376 otherwise would be formed. Of course, the fixing members 2360 can be integrally formed with the heat dissipation plate 2340. The spring clip 2370 is advantageously made of a material having a certain strength and elasticity to support the region of the board 2260b to which the time controller 2310 is mounted.

The spring clip 2370 in this embodiment constructed as described above is mounted such that the base plate 2372 is in contact with the board 2260b and the extensions 2374 are spaced apart by a predetermined distance from the board 2260b. That is, the base plate 2372 is in contact with the bottom of the region of the board 2260b in which the time controller 2310 is mounted, in order to support the weight of the time controller 2310 and the heat dissipation plate 2340, and the extensions 2374 are downwardly bent from the base plate 2372 at a predetermined angle so as to be spaced apart from the board 2260b. In addition, the fixing members 2360 are inserted into the spring clip holes 2376. The fixing members 2360 are inserted into the spring clip holes 2376, the board holes 2261, the heat dissipation plate holes 2341 and the protection plate holes 2351, thereby fastening the spring clip 2370, the board 2260b, the heat dissipation plate 2340 and the protection plate 2350 together. Here, the fixing members 2360 urge the extensions 2374 toward the board 2260b. As gaps between the extensions 2374 and the board 2260b are decreased, a contact force between the base plate 2372 and the board 2260b is increased accordingly, thereby preventing the board 2260b from sagging.

As described above, in this embodiment, the contact forces among the protection plate 2350, the heat dissipation plate 2340 and the board 2260b can be increased by means of the spring clip 2370, thereby further improving the heat dissipation performance. Moreover, in this embodiment, the spring clip 2370 supports the bottom of the region of the board 2260b in which the time controller 2310 is mounted, thereby preventing sagging of the region of the board 2260b in which the time controller 2310 and the heat dissipation plate 2340 are mounted.

Meanwhile, the spring clip 2370 according to this embodiment can be applied to the printed circuit board assembly according to the first embodiment of the present invention. That is, in the printed circuit board assembly according to the first embodiment of the present invention, the spring clip 2370 can be positioned on the first to fourth hook springs 2342a to 2342d fixed to the back surface of the board 2260b on which the time controller 2310 is mounted, thereby preventing the board 2260b from sagging.

Next, an LCD according to the present invention will be explained with reference to the accompanying drawings. Descriptions of the following LCD overlapping those of the printed circuit board assemblies according to the first and second embodiments of the present invention will be omitted or explained briefly.

Figure 6:
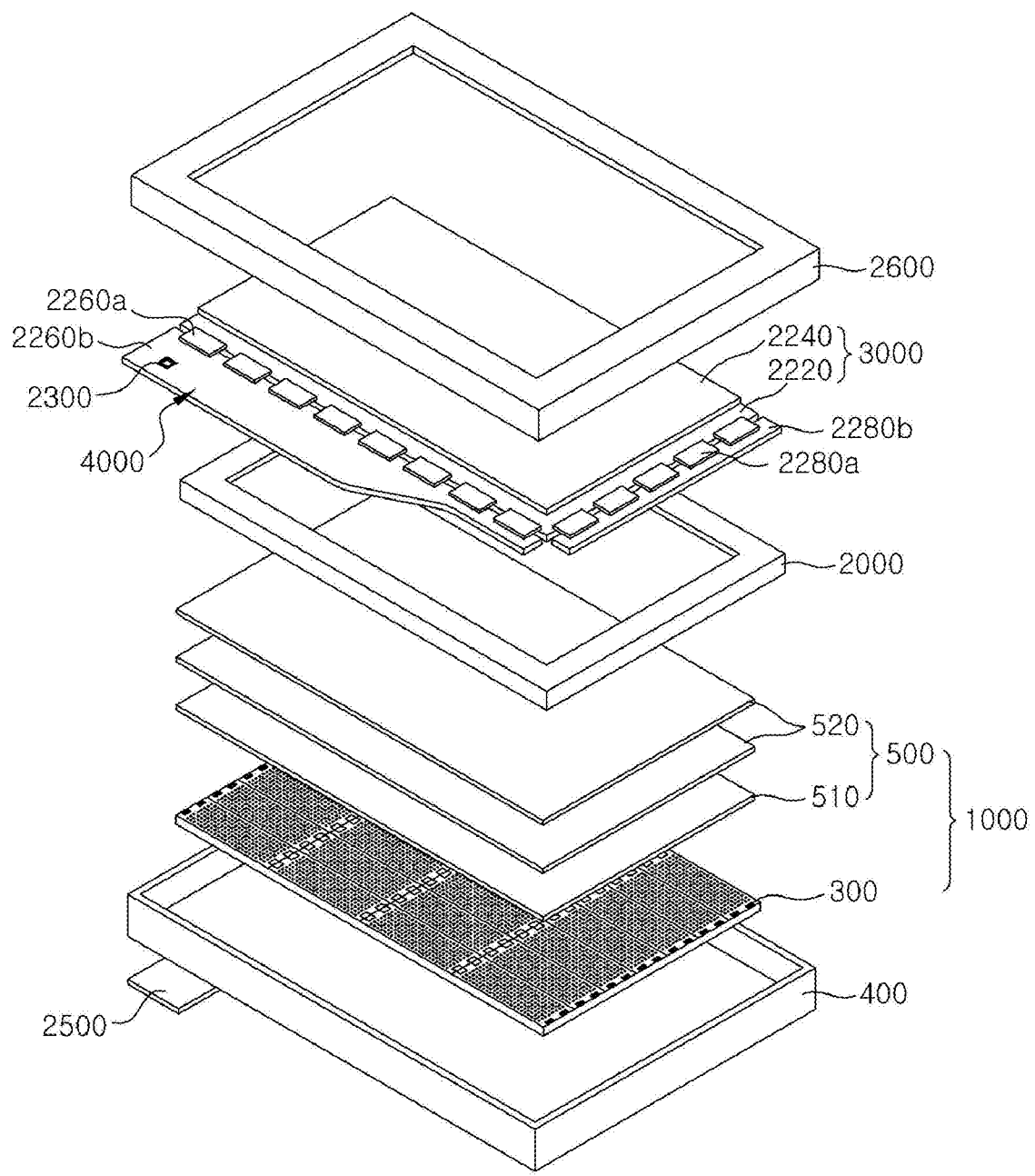
FIG. 6 is an exploded perspective view schematically illustrating a liquid crystal display according to another exemplary embodiment of the present invention.

FIG. 6 is an exploded perspective view schematically illustrating the LCD according to an exemplary embodiment of the present invention.

As shown in FIG. 6, the LCD according to the present invention includes a liquid crystal display panel assembly having a liquid crystal display panel 3000 and a liquid crystal display driving unit 4000 for driving the liquid crystal display panel 3000; and a backlight unit assembly having a backlight unit 1000 for supplying light to the liquid crystal display panel 3000 and a backlight unit-driving unit 2500 for driving the backlight unit 1000. At this time, the LCD can further include upper and lower accommodation members 2600 and 400 for accommodating and protecting the liquid crystal display panel assembly and the backlight unit assembly, respectively.

The liquid crystal display panel assembly includes the liquid crystal display panel 3000 having a thin film transistor substrate 2220, a color filter substrate 2240 corresponding to the thin film transistor substrate 2220, and a liquid crystal layer (not shown) interposed between the thin film transistor substrate 2220 and the color filter substrate 2240; and the liquid crystal display panel driving unit 4000 for driving the liquid crystal display panel 3000. Here, the liquid crystal display panel 3000 can further include polarization plates (not shown) formed above the color filter substrate 2240 and below the thin film transistor substrate 2220, but is not limited to the foregoing arrangement.

The color filter substrate 2240 is a substrate having R, G and B pixels, which are color pixels expressing predetermined colors when light passes therethrough, formed by means of a thin film process. A common electrode (not shown), which is a transparent conductive thin film made of a transparent conductor such as indium tin oxide ("ITO") or indium zinc oxide ("IZO"), is formed on the entire surface of the color filter substrate 2240.

The thin film transistor substrate 2220 is a transparent glass substrate on which thin film transistors ("TFTs") and pixel electrodes (both not shown) are arranged in a matrix form. Data lines (not shown) are connected to source terminals of the TFTs, and gate lines (not shown) are connected to gate terminals thereof. In addition, the pixel electrodes, which are transparent electrodes made of a transparent conductive material, are connected to drain terminals of the TFTs. When electrical signals are input to the data lines and the gate lines, the respective TFTs are turned on or off, so that the electrical signals required for formation of pixels are applied to the drain terminals. Here, the liquid crystal display panel driving unit 4000 can be provided to apply the signals to the liquid crystal display panel 3000.

The liquid crystal display panel driving unit 4000 drives the liquid crystal display panel 3000 and includes data-side and gate-side tape carrier packages ("TCP") 2260*a* and 2280*a* connected to the thin film transistor substrate 2220, data-side and gate-side printed circuit boards ("PCBs") 2260*b* and 2280*b* respectively connected to the data-side and gate-side TCPs 2260*a* and 2280*a*, a field-programmable gate array ("FPGA") (not shown) for outputting a video signal output from a graphic control unit (not shown) such as an analog-to-digital ("A/D") converter board, which receives a video signal applied by an external video card, to the liquid crystal display panel 3000 and the backlight unit 1000, and a time controller assembly ("T-Con assembly") 2300.

The FPGA receives the signal applied by the graphic control unit and outputs the signal, and functions to code and decode the video signal applied by the graphic control unit, to control timing of the applied video signal, and to apply the video signal to the liquid crystal display panel 3000.

The T-Con assembly 2300 controls the timing of the video signal applied to a source driver including the data-side TCP 2260*a* and the data-side PCB 2260*b* and to a gate driver including a gate-side TCP 2280*a* and a gate-side PCB 2280*b* according to a signal applied by the FPGA and a signal applied by an extended display identification data ("EDID") unit (not shown).

The T-Con assembly 2300 can include a time controller 2310, a thermal interface material 2320, a heat dissipation plate 2340, a spring clip 2370 and fixing members 2360, as in FIGS. 1-4. Here, the T-Con assembly 2300 can further include a protection plate 2350 (FIGS. 1-4) for protecting the heat dissipation plate 2340.

Referring again to FIGS. 1-4, the time controller 2310 can be mounted on one surface of the data-side PCB 2260*b*. The thermal interface material 2320, the heat dissipation plate 2340 and the protection plate 2350 can be sequentially provided on the time controller 2310. The spring clip 2370 can be mounted on a back surface of the data-side PCB 2260*b* on which the time controller 2310 is mounted. In addition, holes can be formed respectively in identical regions of the data-side PCB 2260*b*, the heat dissipation plate 2340, the protection plate 2350 and the spring clip 2370. The fixing members 2360, e.g., screws, can be inserted into the holes, thereby fastening the data-side PCB 2260*b*, the heat dissipation plate 2340, the protection plate 2350 and the spring clip 2370 together. It will be apparent that the fixing members 2360 may be integrally formed with the spring clip 2370 if the end portions of the fixing members 2360, e.g., bolts are connected to nuts (not shown).

As described above, the present invention includes the heat dissipation plate 2340, the protection plate 2350 and the thermal interface material 2320 in order to dissipate heat from the time controller 2310, thereby efficiently dissipating heat from the time controller 2310. In addition, the present invention includes the spring clip 2370 to increase the contact forces among the protection plate 2350, the heat dissipation plate 2340 and the board 2260*b*, thereby improving the heat dissipation performance. Moreover, according to the present invention, the spring clip 2370 supports the bottom of the region of the board 2260*b* in which the time controller 2310 is mounted, thereby preventing sagging of the board 2260*b* on which the time controller 2310 and the heat dissipation plate 2340 are mounted.

Referring again to FIG. 6, the backlight unit assembly supplies light to the liquid crystal display panel 3000, and includes the backlight unit 1000 having a light emitting diode assembly 300 with a plurality of light emitting diodes ("LEDs") and an optical sheet 500 disposed on the light emitting diode assembly 300; and the backlight unit-driving unit 2500. The backlight unit assembly can further include a mold frame 2000 for fixing the light emitting diode assembly 300 and the optical sheet 500. In addition, the light emitting diode assembly 300 according to this embodiment will be described, by way of example, as having a plurality of LEDs mounted on a PCB.

The LEDs are light sources of the backlight unit assembly according to this embodiment of the present invention. Each of the LEDs can include a light emitting chip having a compound semiconductor-laminated structure with a p-n junction structure so as to emit light by means of recombination of minority carriers (electrons or holes), a base member for use in mounting the light emitting chip thereon, and an external power input member for applying external power to the light emitting chip.

The LED in this embodiment of the present invention implements colors by forming R, G and B LEDs into one cluster. That is, the colors are implemented by combinations of the R, G and B LEDs. At least one LED cluster can be provided.

It is advantageous to arrange the R, G and B LEDs adjacent to one another such that colors can be mixed. Preferably, the R, G and B LEDs are arranged in a diamond or rectangular shape when viewed in a plan view. The arrangement configuration is not limited thereto but may be variously implemented so far as the R, G and B LEDs are arranged as close as possible such that light emitted from the LEDs can be properly mixed. Here, instead of the use of the R, G and B LEDs, it is possible to use a single package including R, G and B light emitting chips, a base member for packaging the R, G and B light emitting chips, and an external power input member for applying external power to the R, G and B light emitting chips. The present invention is not limited thereto. A specific light emitting chip of insufficient luminance, for example, a green (G) light emitting chip, may be further added. It will be apparent that, in this configuration, the corresponding light emitting chip may also be packaged into the single package or each of the light emitting chips may be individually packaged.

In the meantime, although the LEDs are used as the light sources of the backlight unit 1000 in the present invention, the present invention is not limited thereto. Lamps may be used as the light sources, instead of the LEDs. The light sources may be arranged as a direct type, i.e., those positioned below the liquid crystal display panel 3000 as in the present invention, as well as an edge type, i.e., those positioned at lateral sides of the liquid crystal display panel 3000.

The optical sheet 500 ensures uniform luminance distribution of light emitted from the light sources, and improves the quality of the light. The optical sheet 500 includes a prism sheet 510 for causing angled-incident light of entire incident light to exit vertically, and a diffusion sheet 520 for diffusing light incident from the prism sheet 510 to be uniformly distributed in a wide range. Here, the optical sheet 500 according to this embodiment can include one prism sheet 510 and two diffusion sheets 520. In addition to the prism sheet 510 and the diffusion sheets 520, the optical sheet 500 can further include a protection sheet (not shown) for preventing the prism sheet 510 from being damaged due to the liquid crystal display panel 3000. In alternative embodiments, the diffusion sheets 520 may be eliminated.

The backlight unit-driving unit 2500 drives the plurality of LEDs of the light emitting diode assembly 300, and can include a light emitting diode driver (not shown) for stably driving the LEDs, and a power unit (not shown).

The power unit supplies power to the light emitting diode driver to operate the LEDs, and can include a linear power supply ("LPS") or a switch mode power supply ("SMPS"). Here, it is more advantageous to use the SMPS, which is more compact and more efficient than the LPS, as the power unit.

According to the present invention, it is possible to provide a printed circuit board assembly which includes a heat dissipation plate, a protection plate and a thermal interface material in order to dissipate heat from a time controller, thereby efficiently dissipating heat from the time controller, and an LCD having the printed circuit board assembly. In addition, according to the present invention, it is possible to provide a printed circuit board assembly which includes a spring clip or a hook spring to increase contact forces among a protection plate, a heat dissipation plate and a board, thereby further improving heat dissipation performance, and an LCD having the printed circuit board assembly. Further, according to the present invention, it is possible to provide a printed circuit board assembly, wherein a spring clip supports the bottom of a region of a board in which a time controller is mounted, thereby preventing sagging of the region of the board in which the time controller and a heat dissipation plate are mounted, and an LCD having the printed circuit board assembly.

Although the present invention has been described in connection with the exemplary embodiments and the accompanying drawings, it can be understood that those skilled in the art can make various modifications and changes thereto without departing from the technical spirit of the present invention defined by the appended claims.

For example, although the time controller has been explained by way of example in the exemplary embodiments, the present invention is not limited thereto but can be applied to a printed circuit board assembly mounted with all types of semiconductor devices including the time controller.

What is claimed is:

1. A printed circuit board assembly, comprising:
a board;
a semiconductor device mounted on a first surface of the board;
a heat dissipation plate mounted on one surface of the semiconductor device;
hook springs which bring the semiconductor device and the heat dissipation plate into close contact with each other; and
fixing members penetrating through the heat dissipation plate and the board to fasten the heat dissipation plate and the board to each other.

2. The printed circuit board assembly as claimed in claim 1, wherein each of the hook springs comprises a spring and a hook formed at an end of the spring.

3. The printed circuit board assembly as claimed in claim 2, wherein each of the hook springs is formed on the heat dissipation plate.

4. The printed circuit board assembly as claimed in claim 3, wherein the fixing member comprises a screw or hook.

5. The printed circuit board assembly as claimed in claim 4, wherein the fixing member is integrally formed with the spring clip or heat dissipation plate, or manufactured separately therefrom and then attached thereto.

6. The printed circuit board assembly as claimed in claim 1, further comprising a protection plate in contact with the heat dissipation plate, wherein the protection plate is coupled to the fixing member.

7. The printed circuit board assembly as claimed in claim 1, further comprising a thermal interface material disposed between the semiconductor device and the heat dissipation plate.

8. The printed circuit board assembly as claimed in claim 7, wherein the thermal interface material comprises a thermal pad or thermal grease.

9. The printed circuit board assembly as claimed in claim 1, wherein the semiconductor device comprises a time controller.

10. A printed circuit board assembly, comprising:
a board;
a semiconductor device mounted on a first surface of the board;
a heat dissipation plate mounted on one surface of the semiconductor device;
a spring clip disposed on a second surface opposite the first surface of the board, the spring clip having a base plate contacting the second surface of the board and a plurality of extensions extending from the base plate and away from the second surface of the board;
a fixing member penetrating through the board to fasten the heat dissipation plate and the spring clip to each other; and
a protection plate in contact with the heat dissipation plate, wherein the protection plate is coupled to the fixing member.

11. The printed circuit board assembly as claimed in claim 10, wherein the fixing member comprises a screw or hook.

12. The printed circuit board assembly as claimed in claim 11, wherein the fixing member is integrally formed with the spring clip or heat dissipation plate, or manufactured separately therefrom and then attached thereto.

13. The printed circuit board assembly as claimed in claim 12, wherein the plurality of extensions are formed to be equally spaced apart from one another.

14. The printed circuit board assembly as claimed in claim 10, further comprising a thermal interface material disposed between the semiconductor device and the heat dissipation plate.

15. The printed circuit board assembly as claimed in claim 14, wherein the thermal interface material comprises a thermal pad or thermal grease.

16. The printed circuit board assembly as claimed in claim 10, wherein the semiconductor device comprises a time controller.

17. The printed circuit board assembly as claimed in claim 10, wherein the protection plate is integrally formed with the heat dissipation plate, or separately attached thereto.

18. A liquid crystal display, comprising:
a liquid crystal display panel;
a liquid crystal display panel driving unit which drives the liquid crystal display panel; and
a backlight unit which supplies light to the liquid crystal display panel,
wherein the liquid crystal display panel driving unit comprises:
a board,
a semiconductor device mounted on a first surface of the board,
a heat dissipation plate mounted on one surface of the semiconductor device,
a spring clip disposed on a second surface opposite the first surface of the board, the spring clip having a base plate contacting the second surface of the board and a plurality of extensions extending from the base plate and away from the second surface of the board, and a fixing member penetrating through the board to fasten the heat dissipation plate and the spring clip to each other.

19. A liquid crystal display, comprising:

a liquid crystal display panel;
   a liquid crystal display panel driving unit which drives the liquid crystal display panel; and
   a backlight unit which supplies light to the liquid crystal display panel,
   wherein the liquid crystal display panel driving unit comprises:
   a board,
   a semiconductor device mounted on a first surface of the board,
   a heat dissipation plate mounted on one surface of the semiconductor device,
   a hook spring penetrating through the board to bring the semiconductor device and the heat dissipation plate into close contact with each other, the hook spring having a spring and a hook formed at an end of the spring, and
   fixing members penetrating through the heat dissipation plate and the board to fasten the heat dissipation plate and the board to each other.

* * * * *